United States Patent
Hong

(10) Patent No.: US 8,441,864 B2
(45) Date of Patent: May 14, 2013

(54) SELF REFRESH CIRCUIT

(75) Inventor: Yun Seok Hong, Icheon-si (KR)

(73) Assignee: SK Hynix Inc., Gyeonggi-do (KR)

(*) Notice: Subject to any disclaimer, the term of this patent is extended or adjusted under 35 U.S.C. 154(b) by 280 days.

(21) Appl. No.: 13/035,230

(22) Filed: Feb. 25, 2011

(65) Prior Publication Data

US 2011/0242913 A1 Oct. 6, 2011

(30) Foreign Application Priority Data

Mar. 31, 2010 (KR) .................. 10-2010-0029514

(51) Int. Cl.
*G11C 11/34* (2006.01)

(52) U.S. Cl.
USPC ........ 365/185.25; 365/222; 365/93; 365/194; 365/200; 365/185.19

(58) Field of Classification Search ............. 365/185.25, 365/222, 76, 93, 194
See application file for complete search history.

(56) References Cited

U.S. PATENT DOCUMENTS

| 5,708,611 A | * | 1/1998 | Iwamoto et al. ............. 365/191 |
| 7,636,269 B2 | | 12/2009 | Do |

FOREIGN PATENT DOCUMENTS

| KR | 1020030035836 A | 5/2003 |
| KR | 1020070106159 A | 11/2007 |

* cited by examiner

*Primary Examiner* — Jason Lappas
(74) *Attorney, Agent, or Firm* — William Park & Associates Patent Ltd.

(57) ABSTRACT

A self refresh circuit includes a continuous output interrupting unit and a glitch removing unit. The continuous output interrupting unit is configured to receive a delay self refresh signal, transmit a pulse of an internal active signal as a first output active signal and interrupt the transmission of the pulse of the internal active signal during a first time period. The glitch removing unit is configured to generate and output a second output active signal when the first output active signal has a predetermined pulse width.

39 Claims, 6 Drawing Sheets

SELF REFRESH CIRCUIT

CROSS-REFERENCES TO RELATED APPLICATIONS

The present application claims priority under 35 U.S.C 119(a) to Korean Application No. 10-2010-0029514, filed on Mar. 31, 2010, in the Korean intellectual property Office, which is incorporated herein by reference in its entirety set forth in full.

BACKGROUND

A unit cell of a DRAM includes a switching transistor and a storage capacitor, and data are stored in the storage capacitor. Therefore, unlike an SRAM or a flash memory, a DRAM loses the data stored in the cell due to a leakage current as time passes by. In order to compensate the leakage current, the data stored in the cell are rewritten at certain periods. This operation is called a refresh operation, and the cell becomes electrically connected to a sense amplifier at least once within a data retention time of each cell. Here, the sense amplifier senses/amplifies the data of the cell, and rewrites the same data into the cell, and the retention time is a time during which the data written in a cell can be retained in the cell without a refresh operation.

Refresh operations may be classified into a self refresh operation performed internally by a semiconductor memory device, and an auto refresh operation performed according to an external command of a semiconductor memory device. The self refresh operation generates an internal active signal to perform a periodic refresh operation, and uses a Temperature Compensated Self refresh Oscillator (TCSR) circuit to vary the period of an internal active signal according to the ambient temperature.

FIG. 1 is a block diagram of a known self refresh circuit.

Referring to FIG. 1, the known self refresh circuit includes a temperature signal generating unit 10 and an internal active signal generating unit 11. The temperature signal generating unit 10 is configured to receive a temperature detection signal TEMPDET including a pulse generated when the internal temperature of a semiconductor memory device is higher than 95° C., and generate a temperature signal TEMP95 that is a level signal. The internal active signal generating unit 11 is configured to output a first period signal LTCSR or a second period signal EMRS as an internal active signal PSRF according to the level of the temperature signal TEMP95. Here, the period of the first period signal LTCSR decreases with an increase in temperature, and the period of the second period signal EMRS is constant regardless of temperature. An active operation for a self refresh operation is performed whenever a pulse of the internal active signal PSRF is generated.

FIG. 2 is a timing diagram illustrating an operation of the self refresh circuit illustrated in FIG. 1.

Referring to FIG. 2, when a self refresh operation starts, a self refresh signal SREF changes to logic high level. During the self refresh operation, when the internal temperature of a semiconductor memory device increases from 94° C. to 96° C., a pulse of the temperature detection signal TEMPDE is generated. The temperature signal generating unit 10 generates the temperature signal TEMP95 that changes from logic low level to logic high level after a certain delay time period TD from the input time point of the pulse of the temperature detection signal TEMPDET.

The internal active signal generating unit 11 controls the period of the internal active signal PSRF according to the level of the temperature signal TEMP95. That is, when the temperature signal TEMP95 has a logic low level, the internal active signal generating unit 11 generates the internal active signal PSRF having the same period as the first period signal LTCSR, and when the temperature signal TEMP95 has a logic high level, the internal active signal generating unit 11 generates the internal active signal PSRF having the same period as the second period signal EMRS. Thus, the period of the internal active signal PSRF is inversely proportional to temperature in the logic low level period of the temperature signal TEMP95, and the period of the internal active signal PSRF is constant regardless of temperature in the logic high level period of the temperature signal TEMP95.

However, pulses of the internal active signal PSRF may be generated continuously around the level transition point of the temperature TEMP95 as represented by 'X' of FIG. 2. The pulses of the internal active signal PSRF, which are generated continuously regardless of the period, may cause a self refresh operation fail.

SUMMARY

An embodiment of the present invention relates to a self refresh circuit that can reduce the occurrence of a self refresh operation fail even when pulses of an internal active signal (PSRF) are generated continuously according to a change in the internal temperature of a semiconductor memory device.

In an exemplary embodiment of the present invention, a self refresh circuit includes a continuous output interrupting unit configured to receive a delay self refresh signal, transmit a pulse of an internal active signal as a first output active signal and interrupt the transmission of the pulse of the internal active signal during a first time period, and a glitch removing unit configured to generate and output a second output active signal when the first output active signal has a first pulse width.

In another exemplary embodiment of the present invention, a self refresh circuit includes a first driving unit configured to drive a latch signal in response to a delay self refresh signal and a self refresh signal, a transmission element configured to transmit the internal active signal as an output latch signal in response to the latch signal, a control signal generating unit configured to receive the output latch signal and a delay driving signal, and generate a control signal, and an output controlling unit configured to control the output of the output latch signal in response to the control signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
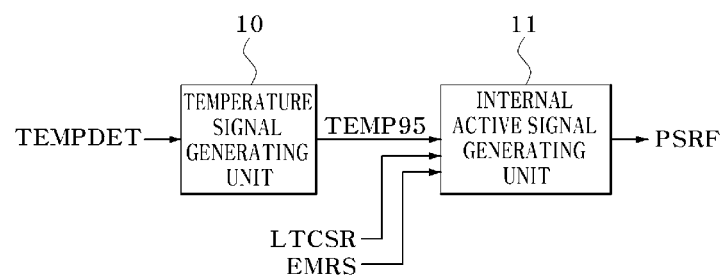
FIG. 1 is a block diagram of a known self refresh circuit.
Figure 2:
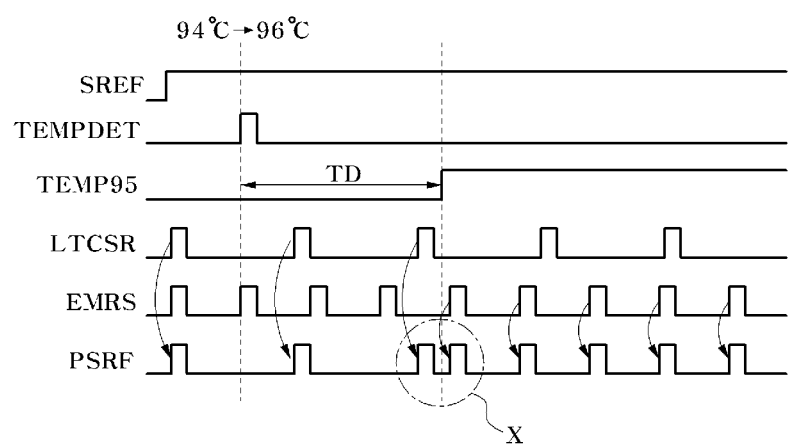
FIG. 2 is a timing diagram illustrating an operation of the self refresh circuit illustrated in FIG. 1.
Figure 3:
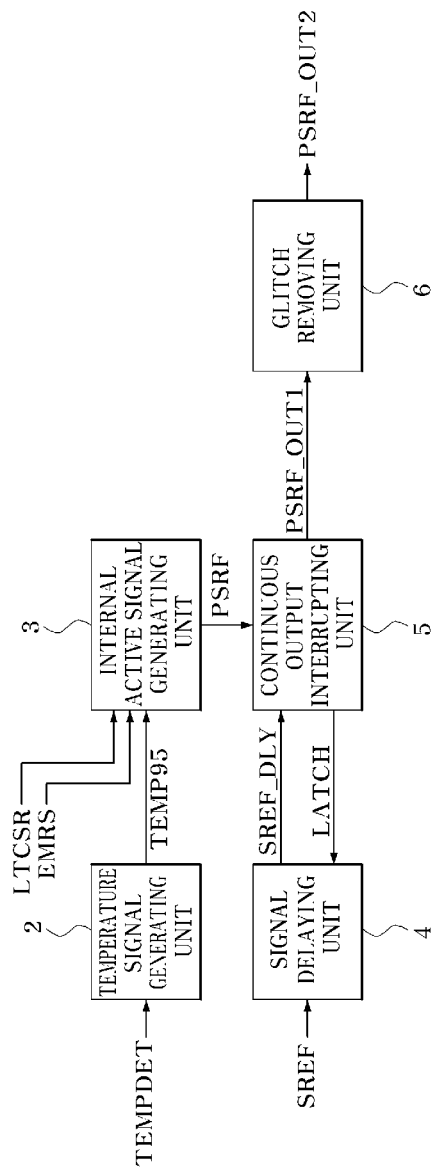
FIG. 3 is a block diagram of a self refresh circuit according to an exemplary embodiment of the present invention.

FIG. 3 is a block diagram of a self refresh circuit according to an exemplary embodiment of the present invention.

Referring to FIG. 3, a self refresh circuit according to an exemplary embodiment of the present invention includes a temperature signal generating unit 2, an internal active signal generating unit 3, a signal delaying unit 4, a continuous output interrupting unit 5, and a glitch removing unit 6.

The temperature signal generating unit 2 is configured to receive a temperature detection signal TEMPDET including a pulse generated when the internal temperature of a semiconductor memory device is higher than approximately 95° C., and generate a temperature signal TEMP95 that is a level signal. Here, the temperature signal TEMP95 changes from logic low level to logic high level after a certain delay time period from the input time point of a pulse of the temperature detection signal TEMPDET.

The internal active signal generating unit 3 is configured to output a first period signal LTCSR or a second period signal EMRS as an internal active signal PSRF according to the level of the temperature signal TEMP95. Here, the period of the first period signal LTCSR decreases with an increase in temperature, and the period of the second period signal EMRS is constant regardless of temperature. Accordingly, when the temperature signal TEMP95 has a logic low level, the internal active signal generating unit 3 generates the internal active signal PSRF having the same period as the first period signal LTCSR, and when the temperature signal TEMP95 has a logic high level, the internal active signal generating unit 3 generates the internal active signal PSRF having the same period as the second period signal EMRS.

Figure 4:
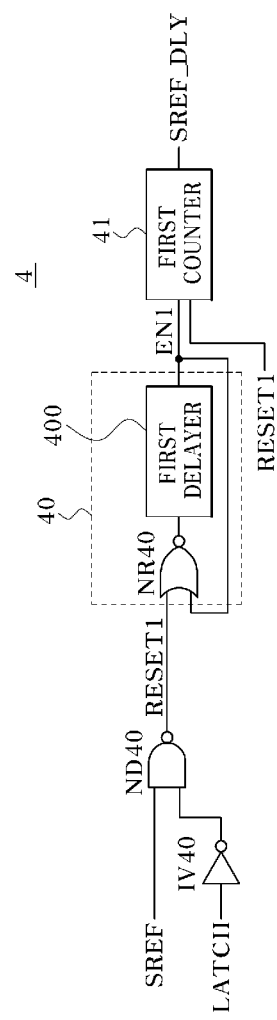
FIG. 4 is a circuit diagram of a signal delaying unit included in the self refresh circuit illustrated in FIG. 3.

FIG. 4 is a circuit diagram of the signal delaying unit 4 included in the self refresh circuit illustrated in FIG. 3.

Referring to FIG. 4, the signal delaying unit 4 includes an inverter IV40, a NAND gate ND40, a first enable signal generating unit 40, and a first counter 41. The inverter IV40 inverts and buffers a latch signal LATCH. The NAND gate ND40 is configured to receive a self refresh signal SREF and an output signal of the inverter IV40, perform a logical NAND operation on the self refresh signal SREF and the output signal of the inverter IV40 and generate a first reset signal RESET1. The first enable signal generating unit 40 is configured to receive the first reset signal RESET1 and a first enable signal EN1 and generate a first enable signal EN1. The first counter 41 is configured to count a delay self refresh signal SREF_DLY as a logic high level when receiving the first enable signal EN1 of a logic high level. Here, when receiving the first reset signal RESET1 of a logic high level, the first counter 41 resets the delay self refresh signal SREF_DLY to a logic low level. The first enable signal generating unit 40 includes a NOR gate NR40 and a first delayer 400. The NOR gate NR40 is configured to receive the first reset signal RESET1 and the first enable signal EN1 and perform a logical NOR operation on the first reset signal RESET1 and the first enable signal EN1. The first delayer 400 is configured to delay an output signal of the NOR gate NR40 by a certain delay time period and output the first enable signal EN1.

Accordingly, the signal delaying unit 4 generates the delay self refresh signal SREF_DLY with a certain pulse width at the time point after a certain time period from the time point of the transition of the self refresh signal SREF to a logic high level. Specifically, when the self refresh signal SREF changes to a logic high level, the first reset signal RESET1 changes to a logic low level to activate the first enable signal EN1 to a logic high level. Thus, the delay self refresh signal SREF_DLY is counted as a logic high level. Also, after a certain time period from the time point of the transition of the self refresh signal SREF to a logic high level, the latch signal LATCH is driven at a logic high level to change the first reset signal RESET1 to a logic high level. Thus, the first counter 41 is reset to change the delay self refresh signal SREF_DLY to a logic low level.

Figure 5:
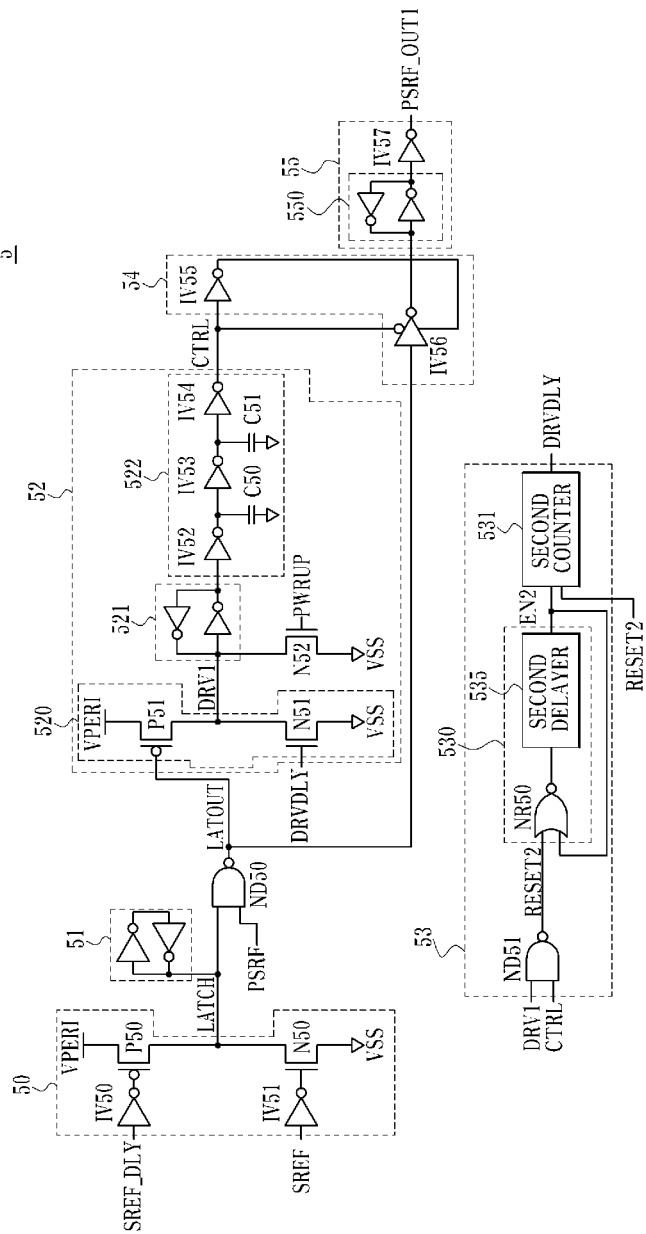
FIG. 5 is a circuit diagram of a continuous output interrupting unit included in the self refresh circuit illustrated in FIG. 3.

FIG. 5 is a circuit diagram of the continuous output interrupting unit 5 included in the self refresh circuit illustrated in FIG. 3.

Referring to FIG. 5, the continuous output interrupting unit 5 includes a first driving unit 50, a first latch 51, a NAND gate ND50, a control signal generating unit 52, a delay driving signal generating unit 53, an output controlling unit 54, and an output unit 55.

The first driving unit 50 includes an inverter IV50, a PMOS transistor P50, an inverter IV51, and an NMOS transistor N50. The inverter IV50 inverts and buffers the delay self refresh signal SREF_DLY. The PMOS transistor P50 operates as a pull-up element that pulls up the voltage level of the latch signal LATCH in response to an output signal of the inverter IV50. The inverter IV51 inverts and buffers the self refresh signal SREF. The NMOS transistor N50 operates as a pull-down element that pulls down the voltage level of the latch signal LATCH in response to an output signal of the inverter IV51.

The first latch 51 is configured to latch the latch signal LATCH. The NAND gate ND50 operates as a transmission element that outputs an output latch signal LATOUT by inverting and buffering the internal active signal PSRF when the latch signal LATCH is pulled up at a logic high level.

The control signal generating unit 52 includes a second driving unit 520, a second latch 521, a delay unit 522, and an NMOS transistor N52. The second driving unit 520 includes a PMOS transistor P51 and an NMOS transistor N51. The PMOS transistor P51 is configured to pull up the voltage level of a first driving signal DRV1 in response to the output latch signal LATOUT, and the NMOS transistor N51 is configured to pull down the voltage level of the first driving signal DRV1 in response to a delay driving signal DRVDLY. The second latch 521 is configured to latch the first driving signal DRV1. The delay unit 522 includes inverters IV52~IV54 and capacitors C50 and C51. The delay unit 522 is configured to delay an output signal of the second latch 521 by a certain time period and generate a control signal CTRL. The NMOS transistor N52 is configured to initialize the first driving signal DRV1 to a logic low level in response to a power-up signal PWRUP set to a logic high level in a power-up period.

Accordingly, the control signal generating unit 52 changes the control signal CTRL to a logic high level at the time point after a time period taken to pass the second driving unit 520, the second latch 521 and the delay unit 522, from the time point of the transition of the output latch signal LATOUT to a logic low level. Thereafter, when the delay driving signal DRVDLY changes to a logic high level, the control signal generating unit 52 changes the control signal CTRL to a logic low level.

The delay driving signal generating unit 53 includes a NAND gate ND51, a second enable signal generating unit 530, and a second counter 531. The NAND gate ND51 is configured to receive the first driving signal DRV1 and the control signal CTRL, perform a logical NAND operation on the first driving signal DRV1 and the control signal CTRL and generate a second reset signal RESET2. The second enable signal generating unit 530 is configured to receive the second reset signal RESET2 and a second enable signal EN2 and generate a second enable signal EN2. The second counter 531 is configured to count the delay driving signal DRVDLY as a logic high level when receiving the second enable signal EN2 of a logic high level. Here, when receiving the second reset signal RESET2 of a logic high level, the second counter 531 resets the delay driving signal DRVDLY to a logic low level. The second enable signal generating unit 530 includes a NOR gate NR50 and a second delayer 535. The NOR gate NR50 is configured to receive the second reset signal RESET2 and the second enable signal EN2 and perform a logical NOR operation on the second reset signal RESET2 and the second enable signal EN2. The second delayer 535 is configured to delay an output signal of the NOR gate NR50 by a certain delay time period and output the second enable signal EN2.

Accordingly, the delay driving signal generating unit 53 generates the delay driving signal DRVDLY that changes to a logic high level at the time point after a time period taken to pass the NAND gate ND51, the second enable signal generating unit 530 and the second counter 531, from the time point of the transition of both the first driving signal DRV1 and the control signal CTRL to a logic high level. Because the delay driving signal DRVDLY of a logic high level changes the first driving signal DRV1 to a logic low level, the second reset signal RESET2 changes to a logic high level to reset the second counter 531. Thus, the delay driving signal DRVDLY generated by the second counter 531 changes to a logic low level.

The output controlling unit 54 includes an inverter IV55 and an inverter IV56. The inverter IV55 is configured to invert and buffer the control signal CTRL. The inverter IV56 is configured to invert and buffer the output latch signal LATOUT in response to the control signal CTRL and an output signal of the inverter IV55. Accordingly, when the control signal CTRL has a logic low level, the output controlling unit 54 inverts/buffers the output latch signal LATOUT by the inverter IV56 prior to output. On the other hand, when the control signal CTRL has a logic high level, the output controlling unit 54 stops an operation of the inverter IV56.

The output unit 55 includes a third latch 550 and an inverter IV57. The third latch 550 is configured to latch an output signal of the output controlling unit 54. The inverter IV57 inverts and buffers an output signal of the third latch 550 and outputs a first output active signal PSRF_OUT1.

Figure 6:
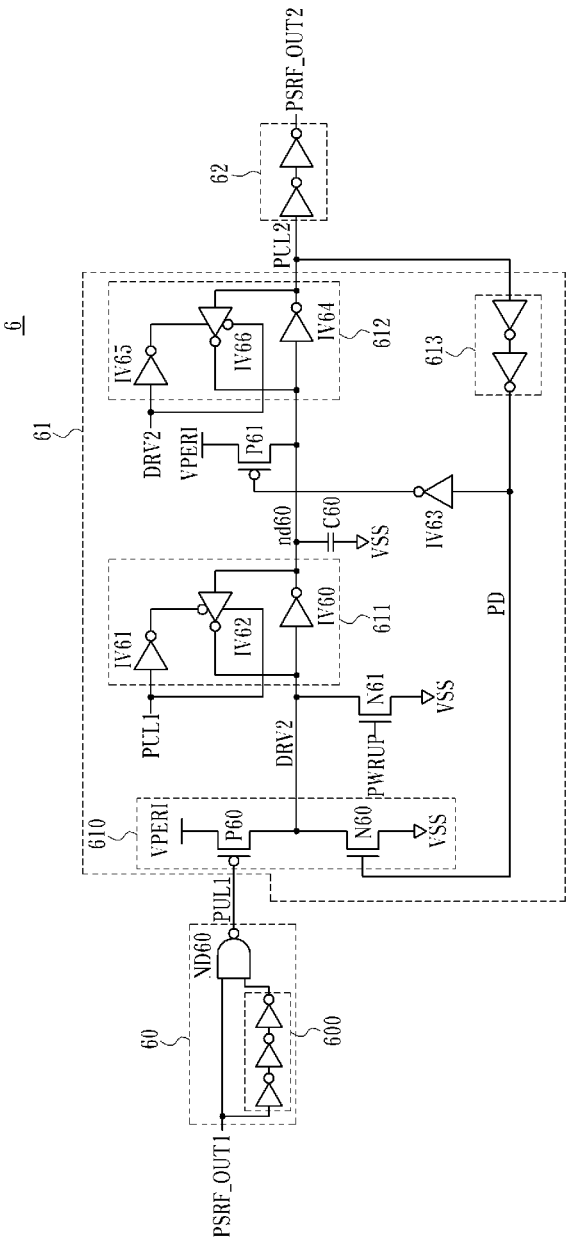
FIG. 6 is a circuit diagram of a glitch removing unit included in the self refresh circuit illustrated in FIG. 3.

FIG. 6 is a circuit diagram of the glitch removing unit 6 included in the self refresh circuit illustrated in FIG. 3.

Referring to FIG. 6, the glitch removing unit 6 includes a first pulse signal generating unit 60, a second pulse signal generating unit 61, and a first buffer unit 62.

The first pulse signal generating unit 60 includes an inversion delay unit 600 and a NAND gate ND60. The inversion delay unit 600 is configured to invert and delay the first output active signal PSRF_OUT1. The NAND gate ND60 is configured to receive the first output active signal PSRF_OUT1 and an output signal of the inversion delay unit 600, perform a logical NAND operation on the first output active signal PSRF_OUT1 and the output signal of the inversion delay unit 600 and generate a first pulse signal PUL1. Accordingly, the first pulse signal generating unit 60 receives the first output active signal PSRF_OUT1 with a certain pulse width and generates the first pulse signal PUL1 with a pulse width corresponding to the delay time period of the inversion delay unit 600. When a glitch occurs in the first output active signal PSRF_OUT, a pulse of the first signal PUL1 is not generated because the first pulse signal generating unit 60 cannot recognize the generated glitch as a logic high level.

The second pulse signal generating unit 61 includes a third driving unit 610, an NMOS transistor N61, a first select latch unit 611, a capacitor C60, a PMOS transistor P61, a second select latch unit 612, and a second buffer unit 613. The third driving unit 610 includes a PMOS transistor P60 and an NMOS transistor N60. The PMOS transistor P60 is configured to pull up the voltage level of the second driving signal DRV2 in response to the first pulse signal PUL1, and the NMOS transistor N60 is configured to pull down the voltage level of the second driving signal DRV2 in response to a pull-down signal PD. The NMOS transistor N61 is configured to initialize the second driving signal DRV2 to a logic low level in response to a power-up signal PWRUP. The first select latch unit 611 includes inverters IV60~IV62. The first select latch unit 611 is configured to latch the second driving signal DRV2 when receiving the first pulse signal PUL1 of a logic high level. The capacitor C60 is configured to stabilize the voltage of a node nd60. The PMOS transistor P61 is configured to pull up the voltage level of the node nd60 when the pull-down signal PD has a logic high level. The second select latch unit 612 includes inverters IV64~IV66. The second select latch unit 612 is configured to latch a signal of the node nd60 and generate a second pulse signal PUL2, when receiving the second driving signal DRV2 of a logic low level. The second buffer unit 613 is configured to buffer the second pulse signal PUL2 and generate the pull-down signal PD.

The first buffer unit 62 is configured to buffer the second pulse signal PUL2 and output a second output active signal PSRF_OUT2.

Figure 7:
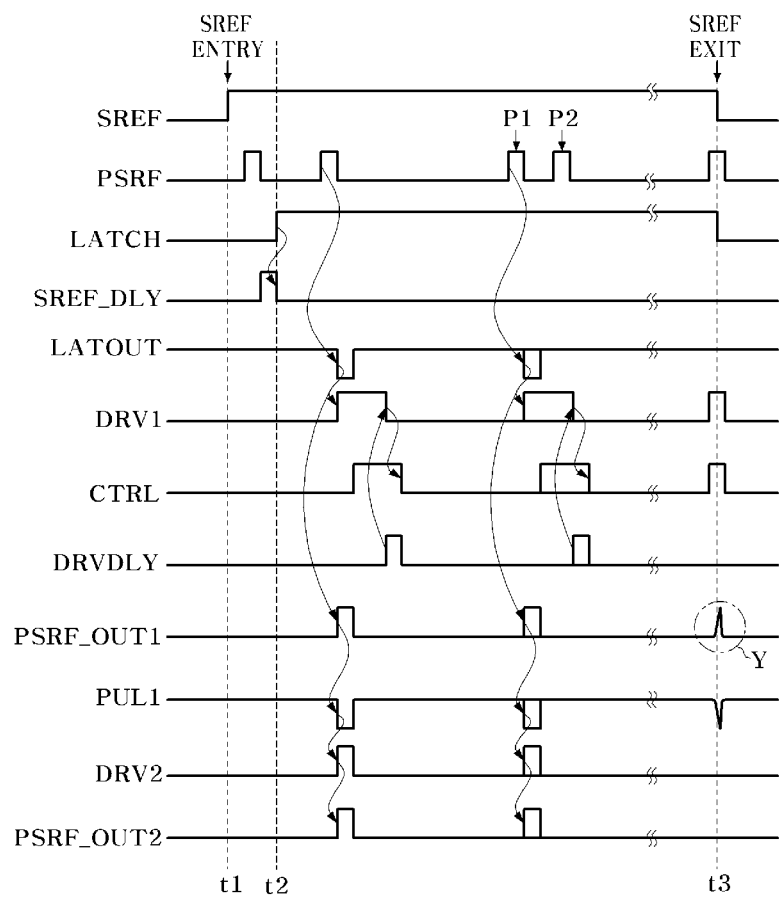
FIG. 7 is a timing diagram illustrating an operation of the self refresh circuit illustrated in FIG. 3.

FIG. 7 is a timing diagram illustrating an operation of the self refresh circuit illustrated in FIG. 3.

Hereinafter, an operation of the self refresh circuit will be described with reference to FIG. 7. The operation of the self refresh circuit is divided into an operation at the entry into a self refresh mode, an operation in the case of the continuous generation of pulses of the internal active signal PSRF, and an operation at the termination of the self refresh mode.

First, an operation of the self refresh circuit at the entry into a self refresh mode will be described below.

At time t1, at the entry into a self refresh mode (SREF ENTRY), the self refresh signal SREF changes to a logic high level. The signal delaying unit 4 of FIG. 4 receives the self refresh signal SREF of a logic high level and changes the delay self refresh signal SREF_DLY to a logic high level at the time point after a time period taken to pass the first enable signal generating unit 40 and the first counter 41.

The first driving unit 50 of the continuous output interrupting unit 5 of FIG. 5 receives the delay self refresh signal SREF_DLY of a logic high level and drives the latch signal LATCH at a logic high level. The latch signal LATCH of a logic high level is inputted into the signal delaying unit 4 of FIG. 4 to change the delay self refresh signal SREF_DLY to a logic low level.

Thus, at the entry into the self refresh mode (SREF ENTRY), a pulse of the delay self refresh signal SREF_DLY is generated after a certain time period and the latch signal LATCH is driven at a logic high level at time t2. Before the latch signal LATCH is driven at a logic high level, because the internal active signal PSRF is not transferred through the NAND gate ND50, an active operation for a self refresh operation is not performed during a time period from time t1 to time t2. In this embodiment, the time period from time t1 to time t2 may be set to approximately 200 nsec. Thus, the self refresh circuit of this embodiment does not perform an active operation for a self refresh operation during a time period of approximately 200 nsec after the entry into the self refresh mode even when a pulse of the internal active signal PSRF is generated.

An operation of the self refresh circuit in the case of the continuous generation of a first pulse P1 and a second pulse P2 of the internal active signal PSRF will be described below.

Referring to FIG. 5, after the entry into the self refresh mode (SREF ENTRY), by the latch signal LATCH driven at a logic high level, a first pulse P1 of the internal active signal PSRF is buffered and transferred as the output latch signal LATOUT. By the control signal CTRL and the first driving signal DRV1 initialized to a logic low level by the power-up signal PWRUP, the output latch signal LATOUT is outputted as the first output active signal PSRF_OUT1 through the inverter IV56 and the output unit 55. That is, the first pulse P1 of the internal active signal PSRF is buffered and outputted as the first output active signal PSRF_OUT1.

Meanwhile, the output latch signal LATOUT is changed to a logic low level by the first pulse P1 of the internal active signal PSRF to pull up the voltage level of the first driving signal DRV1 at a logic high level. When the control signal CTRL is changed to a logic high level by the first driving signal DRV1, the inverter IV56 stops operating so that the output latch signal LATOUT is not outputted as the first output active signal PSRF_OUT1. That is, an operation of the inverter IV56 is stopped during a certain time period after the input of the first pulse P1 of the internal active signal PSFR, so that the output latch signal LATOUT is not outputted as the first output active signal PSRF_OUT1 even when the second pulse P2 of the internal active signal PSFR is inputted.

When both the first driving signal DRV1 and the control signal CTRL are changed to a logic high level by the first pulse P1 of the internal active signal PSRF, the second reset signal RESET2 is changed to a logic low level and the second enable signal EN2 is changed to a logic high level to drive the second counter 531. Thus, the delay driving signal DRVDLY is counted as a logic high level and the control signal generating unit 52 changes the control signal CTRL to a logic low level to drive the inverter IV56. Thus, the subsequent input pulse of the internal active signal PSRF is outputted as the first output active signal PSRF_OUT1.

When the pulse of the first input active signal PSRF_OUT1 is inputted, the first pulse signal generating unit 60 generates the first pulse signal PUL1 having a pulse width corresponding to the delay time period of the inversion delay unit 600. The second pulse signal generating unit 61 receives the first pulse signal PUL1 and generates the second pulse signal PUL2. The first buffer unit 62 buffers the second pulse signal PUL2 and outputs the second output active signal PSRF_OUT2.

Accordingly, the self refresh circuit of this embodiment stops an operation of the inverter IV56 during a certain time period after the input of the internal active signal PSRF, thereby substantially preventing the pulse of the internal active signal PSRF from being outputted as the first output active signal PSRF_OUT1. Thus, it is possible to substantially prevent a self refresh operation fail from being caused by the pulses of the internal active signal PSRF that are generated, regardless of the period, continuously around the time point of the transition of the level of the temperature signal TEMP95.

An operation of the self refresh circuit at the termination of the self refresh mode will be described below.

When the self refresh mode is terminated at time t3 (SREF EXIT), because the self refresh signal SREF changes to a logic low level, the first driving unit 50 of FIG. 5 pulls-down the voltage level of the latch signal LATCH. Thus, the NAND gate ND50 interrupts the transmission of the internal active signal PSRF. At this point, when a pulse of the internal active signal PSRF is inputted, a glitch occurs in the first output active signal PSRF_OUT1.

Even when a glitch occurs in the first output active signal PSRF_OUT1, the first pulse signal generating unit 60 does not generate a pulse of the first pulse signal PUL1. Thus, a pulse of the second output active signal PSRF_OUT2 is not generated by the glitch of the first output active signal PSRF_OUT1.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A self refresh circuit comprising:
a continuous output interrupting unit configured to receive a delay self refresh signal, transmit a pulse of an internal active signal as a first output active signal and interrupt the transmission of the pulse of the internal active signal during a first time period; and
a glitch removing unit configured to generate and output a second output active signal when the first output active signal has a predetermined pulse width.

2. The self refresh circuit of claim 1, wherein the continuous output interrupting unit comprises:
a first driving unit configured to drive a latch signal in response to the delay self refresh signal and a self refresh signal;
a transmission element configured to transmit the internal active signal as an output latch signal in response to the latch signal;
a control signal generating unit configured to receive the output latch signal and a delay driving signal, and generate a control signal; and
an output controlling unit configured to control the output of the output latch signal in response to the control signal.

3. The self refresh circuit of claim 2, wherein the first driving unit comprises:
a pull-up element configured to pull up the voltage level of the latch signal in response to a buffered signal of the delay self refresh signal; and
a pull-down element configured to pull down the voltage level of the latch signal in response to a buffered signal of the self refresh signal.

4. The self refresh circuit of claim 2, wherein the continuous output interrupting unit further comprises a latch configured to latch the latch signal.

5. The self refresh circuit of claim 2, wherein when the latch signal is pulled up, the transmission element buffers the internal active signal and outputs the same as the output latch signal.

6. The self refresh circuit of claim 2, wherein the control signal generating unit is configured to receive a pulse of the output latch signal, generate the control signal for outputting the output latch signal through the output controlling unit during a first delay time period, and generate the control signal for interrupting the output of the output latch signal during a second delay time period after the first delay time period.

7. The self refresh circuit of claim 6, wherein the control signal generating unit comprises:

a second driving unit configured to drive a driving signal in response to the output latch signal and the delay driving signal;
a latch configured to latch the driving signal; and
a delay unit configured to delay an output signal of the latch by a second time period and generate the control signal.

8. The self refresh circuit of claim 7, wherein the second driving unit comprises:
a pull-up element configured to pull up the voltage level of the driving signal in response to the output latch signal; and
a pull-down element configured to pull down the voltage level of the driving signal in response to the delay driving signal.

9. The self refresh circuit of claim 7, wherein the first delay time period is determined as a time period taken to transmit the output latch signal through the second driving unit, the latch and the delay unit.

10. The self refresh circuit of claim 7, wherein the control signal generating unit further comprises an initialization element configured to initialize the driving signal in response to a power-up signal.

11. The self refresh circuit of claim 7, further comprising:
a delay driving signal generating unit configured to generate the delay driving signal, which is activated at the time point after a third time period from the time point of the activation of the driving signal, in response to the control signal.

12. The self refresh circuit of claim 11, wherein the delay driving signal generating unit comprises:
a first logic element configured to receive the driving signal and the control signal, and generate a reset signal; and
an enable signal generating unit configured to receive the reset signal and an enable signal, and generate the enable signal.

13. The self refresh circuit of claim 12, wherein the enable signal generating unit comprises:
a second logic element configured to receive the reset signal and the enable signal, and perform a logical operation thereon; and
a delayer configured to delay an output signal of the second logic element by a fourth time period.

14. The self refresh circuit of claim 12, wherein the delay driving signal generating unit further comprises a counter configured to receive the enable signal and count the delay driving signal,
wherein the counter is reset in response to the reset signal.

15. The self refresh circuit of claim 6, wherein the output controlling unit comprises a buffer configured to receive a pulse of the output latch signal, buffer the output latch signal during the first delay time period, and stop operating during the second delay time period after the first delay time period.

16. The self refresh circuit of claim 2, wherein the continuous output interrupting unit further comprises an output unit configured to latch and buffer an output signal of the output controlling unit.

17. The self refresh circuit of claim 1, wherein the glitch removing unit comprises:
a first pulse signal generating unit configured to receive the first output active signal and generate a first pulse signal; and
a second pulse signal generating unit configured to control the pulse width of the first pulse signal and generate a second pulse signal.

18. The self refresh circuit of claim 17, wherein the first pulse signal generating unit comprises:

an inversion delay unit configured to invert and delay the first output active signal; and
a logic element configured to receive the first output active signal and an output signal of the inversion delay unit, and perform a logical operation thereon.

19. The self refresh circuit of claim 17, wherein the second pulse signal generating unit comprises:
a driving unit configured to drive a driving signal in response to the first pulse signal and a pull-down signal;
a first select latch unit configured to receive and latch the driving signal in response to the first pulse signal;
a second select latch unit configured to receive and latch an output signal of the first select latch unit and generate the second pulse signal in response to the driving signal; and
a buffer unit configured to buffer the second pulse signal and generate the pull-down signal.

20. The self refresh circuit of claim 19, wherein the second pulse signal generating unit further comprises:
an initialization element configured to initialize the driving signal in response to a power-up signal;
a stabilization element configured to stabilize the voltage of an output node of the first select latch unit; and
a driving element configured to drive the output node in response to an output signal of the buffer unit.

21. The self refresh circuit of claim 2, further comprising:
a signal delaying unit configured to delay the self refresh signal by a fifth time period in response to the latch signal and generate the delay self refresh signal.

22. The self refresh circuit of claim 21, wherein the signal delaying unit comprises:
a buffer configured to buffer the latch signal;
a first logic element configured to receive the self refresh signal and an output signal of the buffer, and generate a reset signal; and
an enable signal generating unit configured to receive the reset signal and an enable signal, and generate the enable signal.

23. The self refresh circuit of claim 22, wherein the enable signal generating unit comprises:
a second logic element configured to receive the reset signal and the enable signal, and perform a logical operation thereon; and
a delayer configured to delay an output signal of the second logic element by a sixth delay time period.

24. The self refresh circuit of claim 21, wherein the signal delaying unit further comprises a counter configured to receive the enable signal and count the delay self refresh signal,
wherein the counter is reset in response to the reset signal.

25. A self refresh circuit comprising:
a first driving unit configured to drive a latch signal in response to a delay self refresh signal and a self refresh signal;
a transmission element configured to transmit the internal active signal as an output latch signal in response to the latch signal;
a control signal generating unit configured to receive the output latch signal and a delay driving signal, and generate a control signal; and
an output controlling unit configured to control the output of the output latch signal in response to the control signal.

26. The self refresh circuit of claim 25, wherein the first driving unit comprises:
a pull-up element configured to pull up the voltage level of the latch signal in response to a buffered signal of the delay self refresh signal; and a pull-down element configured to pull down the voltage level of the latch signal in response to a buffered signal of the self refresh signal.

27. The self refresh circuit of claim 25, further comprising:
a latch configured to latch the latch signal.

28. The self refresh circuit of claim 25, wherein when the latch signal is pulled up, the transmission element buffers the internal active signal and outputs the internal active signal as the output latch signal.

29. The self refresh circuit of claim 25, wherein the control signal generating unit is configured to receive a pulse of the output latch signal, generate the control signal for outputting the output latch signal through the output controlling unit during a first delay time period, and generate the control signal for interrupting the output of the output latch signal during a second delay time period after the first delay time period.

30. The self refresh circuit of claim 29, wherein the control signal generating unit comprises:
a second driving unit configured to drive a driving signal in response to the output latch signal and the delay driving signal;
a latch configured to latch the driving signal; and
a delay unit configured to delay an output signal of the latch by a first time period and generate the control signal.

31. The self refresh circuit of claim 30, wherein the second driving unit comprises:
a pull-up element configured to pull up the voltage level of the driving signal in response to the output latch signal; and
a pull-down element configured to pull down the voltage level of the driving signal in response to the delay driving signal.

32. The self refresh circuit of claim 30, wherein the first delay time period is determined as a time period taken to transmit the output latch signal through the second driving unit, the latch and the delay unit.

33. The self refresh circuit of claim 30, wherein the control signal generating unit further comprises an initialization element configured to initialize the driving signal in response to a power-up signal.

34. The self refresh circuit of claim 30, further comprising:
a delay driving signal generating unit configured to generate the delay driving signal, which is activated at the time point after a second time period from the time point of the activation of the driving signal, in response to the control signal.

35. The self refresh circuit of claim 34, wherein the delay driving signal generating unit comprises:
a first logic element configured to receive the driving signal and the control signal, and generate a reset signal; and
an enable signal generating unit configured to receive the reset signal and an enable signal, and generate the enable signal.

36. The self refresh circuit of claim 35, wherein the enable signal generating unit comprises:
a second logic element configured to receive the reset signal and the enable signal, and perform a logical operation thereon; and
a delayer configured to delay an output signal of the second logic element by a third time period.

37. The self refresh circuit of claim 35, wherein the delay driving signal generating unit further comprises a counter configured to receive the enable signal and count the delay driving signal,
wherein the counter is reset in response to the reset signal.

38. The self refresh circuit of claim 25, wherein the output controlling unit comprises a buffer configured to receive a pulse of the output latch signal, buffer the output latch signal during the first delay time period, and stop operating during the second delay time period after the first delay time period.

39. The self refresh circuit of claim 25, further comprising:
an output unit configured to latch and buffer an output signal of the output controlling unit.

* * * * *